(12) United States Patent
Shen et al.

(10) Patent No.: US 9,978,994 B2
(45) Date of Patent: May 22, 2018

(54) ORGANIC LIGHT EMITTING DISPLAY PANEL AND DISPLAY APPARATUS

(71) Applicant: BOE Technology Group Co., Ltd., Beijing (CN)

(72) Inventors: Wulin Shen, Beijing (CN); Dongfang Wang, Beijing (CN); Haijing Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days. days.

(21) Appl. No.: 15/022,238

(22) PCT Filed: Apr. 24, 2014

(86) PCT No.: PCT/CN2014/076136
§ 371 (c)(1),
(2) Date: Mar. 16, 2016

(87) PCT Pub. No.: WO2015/100885
PCT Pub. Date: Jul. 9, 2015

(65) Prior Publication Data
US 2016/0233458 A1    Aug. 11, 2016

(30) Foreign Application Priority Data
Dec. 31, 2013  (CN) .......................... 2013 1 0750083

(51) Int. Cl.
*H01L 51/52*    (2006.01)
*H01L 27/32*    (2006.01)

(52) U.S. Cl.
CPC ........ *H01L 51/5284* (2013.01); *H01L 27/322* (2013.01); *H01L 27/3211* (2013.01);
(Continued)

(58) Field of Classification Search
None
See application file for complete search history.

(56) References Cited

U.S. PATENT DOCUMENTS 6,411,028 B1   6/2002  Chigusa et al.
6,608,449 B2 *  8/2003  Fukunaga ........... H01L 27/3244
                                                    313/494
(Continued)

FOREIGN PATENT DOCUMENTS

CN    1791957 A    6/2006
CN    1964062 A    5/2007
(Continued)

OTHER PUBLICATIONS

International Search Report and Written Opinion for International Application No. PCT/CN2014/076136, dated Sep. 19, 2014, 10 pages.
(Continued)

*Primary Examiner* — Fernando L Toledo
*Assistant Examiner* — Valerie N Newton
(74) *Attorney, Agent, or Firm* — Westman, Champlin, & Koehler, P.A.

(57) ABSTRACT

The present disclosure relates to an organic light emitting display panel and a display apparatus. The organic light emitting display panel includes: a first substrate provided with a plurality of pixels each comprising an organic light emitting diode; a second substrate having at least one auxiliary electrode electrically connected to a cathode of the organic light emitting diode, each auxiliary electrodes being located on a side of the second substrate facing the first substrate and corresponding to a gap between adjacent pixels on the first substrate; and an antireflection layer formed on the auxiliary electrode for absorbing light rays directed to the auxiliary electrode. In the present disclosure, by the auxiliary electrode formed on the second substrate and electrically connected to the cathode on the first substrate, the voltage drop of the cathode may be significantly reduced, and the uniformity of the display brightness is
(Continued)

improved. Meanwhile, by the antireflection layer formed on the auxiliary electrode, light leakage phenomenon due to reflection of a metal auxiliary electrode may be prevented, thereby improving contrast ratio of the display.

19 Claims, 3 Drawing Sheets

(52) U.S. Cl.
CPC ........ *H01L 51/5228* (2013.01); *H01L 51/525* (2013.01); *H01L 2251/5315* (2013.01)

(56) References Cited

U.S. PATENT DOCUMENTS

| | | | |
|---|---|---|---|
| 6,869,751 B1* | 3/2005 | Asida | H01J 9/02 430/314 |
| 7,422,503 B2 | 9/2008 | Fujitani et al. | |
| 8,354,980 B2 | 1/2013 | Kwak | |
| 8,736,163 B2 | 5/2014 | Kim et al. | |
| 2005/0236629 A1* | 10/2005 | Lee | H01L 51/5228 257/79 |
| 2007/0285776 A1 | 12/2007 | Nakamura et al. | |
| 2010/0097295 A1* | 4/2010 | Kwak | H01L 27/322 345/32 |
| 2012/0097990 A1* | 4/2012 | Koh | H01L 27/3244 257/88 |
| 2012/0218637 A1 | 8/2012 | Shibayama et al. | |
| 2012/0249942 A1 | 10/2012 | Yoshihara | |

FOREIGN PATENT DOCUMENTS

| | | |
|---|---|---|
| CN | 101097942 A | 1/2008 |
| CN | 101728419 A | 6/2010 |
| CN | 103715231 A | 4/2014 |
| CN | 203631557 U | 6/2014 |

OTHER PUBLICATIONS

English translation of Box No. V. from the Written Opinion of the International Searching Authority for International Application No. PCT/CN2014/076136, 2 pages.

First Office Action, including Search Report, for Chinese Patent Application No. 201310750083.1, dated Oct. 9, 2015, 12 pages.

Second Office Action, including Search Report, for Chinese Patent Application No. 201310750083.1, dated Mar. 8, 2016, 12 pages.

* cited by examiner

ORGANIC LIGHT EMITTING DISPLAY PANEL AND DISPLAY APPARATUS

CROSS-REFERENCE TO RELATED APPLICATION

This Application is a Section 371 National Stage Application of International Application No. PCT/CN2014/076136, filed 24 Apr. 2014 and published as WO 2015/100885 on 9 Jul. 2015, in Chinese, the contents of which are hereby incorporated by reference in their entirety.

BACKGROUND OF THE INVENTION

Field of the Invention

Embodiments of the present invention relate to a display apparatus, in particular, to an organic light emitting display panel for a display apparatus and a display apparatus.

Description of the Related Art

An organic light emitting display panel is a new type of flat-panel display apparatus, which has many advantages, such as active emission, high brightness, ultrathin thickness, low power consumption, wide angle of view, wide operating temperature range, and the like.

In the organic light emitting display panel, an organic electroluminescent device (OLED) may be divided into two types, i.e., bottom-emitting type and top-emitting type, according to the direction of emergent light. FIG. 1 is a schematic structural view of a conventional bottom-emitting organic electroluminescent device in the prior art, in which the device comprises a reflective cathode 11, an electron transport layer 12, a light emitting layer 13, a hole transport layer 14, a transparent anode 15 and a substrate 16 arranged sequentially in a transmission direction of light. In such device, Indium Tin Oxide (ITO) is generally used as the transparent anode, and the light exits from a side of the device where the substrate provided with ITO material is located, therefore such device is referred to as a Bottom-Emitting device (Bottom-Emitting OLED, BEOLED). In contrast, light of a Top-Emitting device (Top-emitting OLED, TEOLED) exits from a side of the device where a top electrode is located. Correspondingly, FIG. 2 is a schematic structural view of a top-emitting organic electroluminescent device in the prior art, in which the device comprises a cathode 21, an electron transport layer 22, a light emitting layer 23, a hole transport layer 24, a reflective anode 25 and a substrate 26 arranged sequentially in the reverse transmission direction of the light, and the light of the device exits from the cathode 21.

In a conventional bottom-emitting device, the light is restrained to be emitted out of the device through an opening portion provided in an array substrate, which is used for driving the organic light emitting display panel. However, such device has a complicated OLED pixel driving circuit, typically requiring at least two thin film transistors (TFT) and one capacitor, as a result, a majority of light is wasted due to obstruction of the TFT and various electrodes, thereby causing a very low aperture ratio, for example, the light emitted out of the panel in the bottom-emitting device is typically approximately 30-50% of the light emitted from the light emitting layer. Instead, the top-emitting device may solve the shortcoming of low aperture ratio accompanying with the common bottom-emitting device since the top-emitting device emits light from a surface of a top cathode thereof directly, without negative affection on the aperture ratio, thereby facilitating achievement of a large scale, high information content, high display brightness, high resolution, organic flat-panel display.

In the top-emitting device, light is required to exit the device through a cathode of an organic light emitting diode, so it requires that material of the cathode has a relatively high transmittance. With regard to selection of the cathode material in the top-emitting device, there are mainly two types of material, one type of material comprises transparent oxide, for example, Indium Tin Oxide (ITO), and the other type of material comprises metal material. As a kind of transparent electrically conductive material, ITO may reduces light loss in the top emitting process, however, such material has related disadvantages, such as high resistance, complicated sputter process and damage to the organic layer derived from the sputter process, thus affecting display effect. As shown in FIG. 2, the other type of metal material may be plated onto a surface layer of the electron transport layer by a thermal-evaporation method, so as to form a metal cathode. At present, the material used for the metal cathode includes Al, Ag, Al/Ag, Mg/Ag, Ca/Ag, Sm/Ag, and so on. A manufacturing process of the metal cathode is simple, and the evaporation of metal material applies a little damage to the organic layer. However, the thickness of the metal cathode layer is required to be controlled during the evaporation of such metal material. Too thick metal cathode may reduce the transmittance of the device, further affect the display brightness, thereby increasing power consumption for displaying. Based on this, the metal cathode in the top-emitting device is generally provided to be relatively thinner, however, an overall resistance of the thin metal cathode is extremely large, it therefore leads to a relatively high voltage drop. Particularly, the voltage drop across the cathode increases significantly with the increase of dimension thereof, thereby incurring a non-uniform image quality and display characteristic.

SUMMARY OF THE INVENTION

In view of the above and other deficiencies in the prior art, the embodiments of the present invention provide an organic light emitting display panel and a display apparatus, in which a cathode has an increased electrical conductivity, thereby effectively reducing voltage drop due to a extremely thin cathode.

According to a further aspect of the embodiments of the present invention, there is provided an organic light emitting display panel and a display apparatus, which may improve display uniformity.

According to an aspect of the present disclosure, there is provided an organic light emitting display panel, comprising: a first substrate provided with a plurality of pixels each comprising an organic light emitting diode; a second substrate having at least one auxiliary electrode electrically connected to a cathode of the organic light emitting diode, each auxiliary electrodes being located on a side of the second substrate facing the first substrate and corresponding to a gap between adjacent pixels on the first substrate; and an antireflection layer formed on the auxiliary electrode for absorbing light rays directed to the auxiliary electrode.

In the above organic light emitting display panel, the auxiliary electrode has a grid-like structure.

In the above organic light emitting display panel, the material of the auxiliary electrode is selected from Al, Mo, Cu, Ag, Cr, Au, and combinations thereof.

In the above organic light emitting display panel, the auxiliary electrode has a lower resistance than the cathode.

In the above organic light emitting display panel, the antireflection layer covers a surface of the auxiliary electrode by an area larger than or equal to the surface area of the auxiliary electrode, and margins of the antireflection layer do not go beyond a non-display region located between the adjacent pixels.

In the above organic light emitting display panel, the antireflection layer is made of black electrically conductive material or mixed material containing black pigment and electrically conductive powder.

In the above organic light emitting display panel, the black electrically conductive material comprises ruthenium oxide.

In the above organic light emitting display panel, the black pigment of the mixed material comprises at least one of cobalt oxide, black-titanium, sub-titanium oxide and graphite, and the electrically conductive powder of the mixed material comprises at least one of Mo, Al, Cu, Ag, Ti and Fe.

In the above organic light emitting display panel, a spacer is formed on the antireflection layer, the contact area between the spacer and the antireflection layer being less than the surface area of the antireflection layer.

In the above organic light emitting display panel, a transparent conductive layer is formed on the surface of the antireflection layer and the spacer, the transparent conductive layer being in contact with the cathode so as to electrically connect the auxiliary electrode to the cathode.

In the above organic light emitting display panel, the transparent conductive layer is made of any one of indium tin oxide and indium zinc oxide, or a combination thereof.

In the above organic light emitting display panel, the transparent conductive layer is electrically connected to the cathode at the gap between the adjacent pixels on the first substrate.

In the above organic light emitting display panel, the transparent conductive layer is arranged to totally cover the second substrate, and electrically connected to a surface of the antireflection layer facing the first substrate and a side surface of the auxiliary electrode.

In the above organic light emitting display panel, the organic light emitting diode comprises a light emitting layer for emitting white light.

In the above organic light emitting display panel, a display region of the second substrate comprises a red filtering layer, a green filtering layer, and a blue filtering layer.

In the above organic light emitting display panel, the organic light emitting diode comprises a light emitting layer for emitting red light, green light or blue light.

In the above organic light emitting display panel, the second substrate comprises a black matrix located between the adjacent pixels.

In the above organic light emitting display panel, the first substrate further comprises a plurality of thin film transistors electrically connected to the organic light emitting diode.

According to a further aspect of the present disclosure, there is provided a display apparatus, comprising the organic light emitting display panel according to the above various embodiments.

According to the organic light emitting display panel provided in the above various embodiments of the present invention, the auxiliary electrode is provided in the second substrate, and electrically connected to the cathode. As a result, it increases the electrical conductivity of the cathode, thereby effectively reducing the voltage drop caused by the extremely thin cathode and the extremely high resistance, and improving the display uniformity. In comparison to the conventional organic light emitting display panel, in which an auxiliary electrode is provided on a first substrate having a complicated structure and produced through a large number of processes, the auxiliary electrode provided on the second substrate may prevent producing process of the auxiliary electrode from damaging the organic light emitting diode in the first substrate, thereby improving overall good quality rate of the organic light emitting display panel. Furthermore, since the antireflection layer is formed on the auxiliary electrode, it may absorb light rays emitted onto the auxiliary electrode, and reduce light leakage between the pixels caused by reflection of the auxiliary electrode, thereby improving contrast ratio of the display.

When the organic light emitting display panel is applied to the display apparatus, the provision of the auxiliary electrode may reduce the voltage drop of the display apparatus caused by the extremely thin cathode and the extremely high resistance, make the display apparatus have excellent display uniformity. In addition, since the antireflection layer is formed on the auxiliary electrode, it may absorb light rays emitted onto the auxiliary electrode, and reduce light leakage between the pixels caused by reflection of the auxiliary electrode, thereby improving the display contrast ratio of the display apparatus.

DETAILED DESCRIPTION OF PREFERRED EMBODIMENTS OF THE INVENTION

Figure 1:
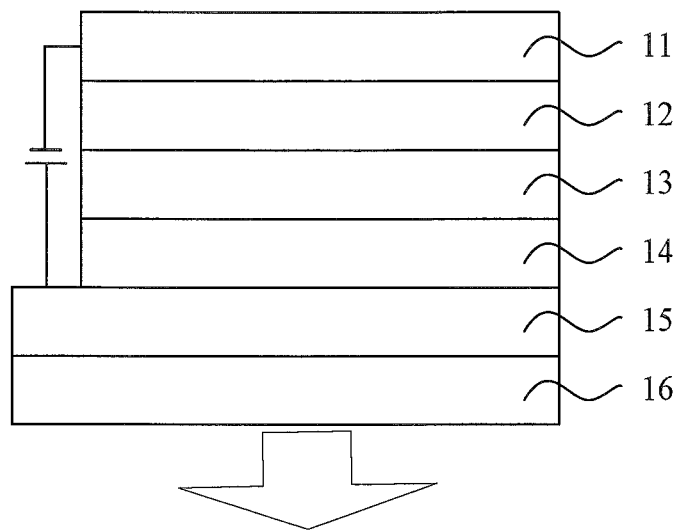
FIG. 1 is a schematic structural view of a conventional bottom-emitting organic electroluminescent device in the prior art.
Figure 2:
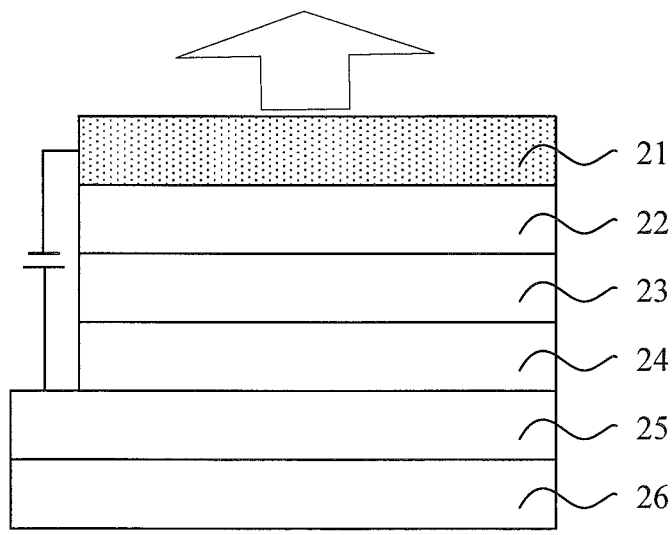
FIG. 2 is a schematic structural view of a top-emitting organic electroluminescent device in the prior art.

The present invention will be further described in detail below, in combination with the accompanying figures and the detailed implementations, in order that the technical solutions of the present invention are better understood by the person skilled in the art. Obviously, the described embodiments are merely a part of all embodiments, rather than all of embodiments. All of the other embodiments obtained by the person skilled in the art without creative effort fall into the scope of the present invention.

In addition, in the following detailed description, for purposes of description, a number of specific details are explained to provide a comprehensive understanding to the embodiments of the present disclosure. However, it is obvious that one or more embodiments may be implemented without these specific details. In other cases, conventional structures and devices are shown in schematic diagrams to simplify the drawings.

Now it is necessary to provide the following explanations regarding the depiction of the present embodiments, so as to provide a better understanding of the technical solutions of the present invention for the person skilled in the art:

Firstly, in order to describe clearly position relationship of various structures in the organic light emitting display panel of the embodiments of the present invention, with reference to a conventional manufacturing sequence of a first substrate and a second substrate and the structure of the finally formed organic light emitting display panel after assembling, the expressions "up", "above" used in the implementations are limited as follows: as for the structures in the first substrate, "up" refers to a direction close to or facing to the second substrate; as for the structures in the second substrate, "up" refers to a direction close to or facing to the first substrate. For example, "A is located above B" should be understood that "A is located at a side of B close to or facing to the first substrate" when describing the structures in the second substrate; "C is located above D" should be understood that "C is located at a side of D close to or facing to the second substrate" when describing the structures in the first substrate. In addition, if one structure is located above another structure, the one structure may be directly located on the other structure, or indirectly located on the other structure with one or more intermediate structures located between thereof.

Secondly, in the depiction of the embodiments of the organic light emitting display panel of the present invention, it will be appreciated that the terminology of "electrical(ly) connection (connected)" covers the cases where structures are directly contacted with each other, or indirectly electrically connected to each other by one or more other intermediate electrically conductive structures.

According to a general concept of the present invention, there is provided an organic light emitting display panel, comprising: a first substrate provided with a plurality of pixels, each pixel comprising an organic light emitting diode; a second substrate having at least one auxiliary electrode electrically connected to a cathode of the organic light emitting diode, each of the auxiliary electrodes being located on a side of the second substrate facing the first substrate and corresponding to a gap between adjacent pixels on the first substrate; and an antireflection layer formed on the auxiliary electrode for absorbing light rays directed to the auxiliary electrode.

Figure 3:
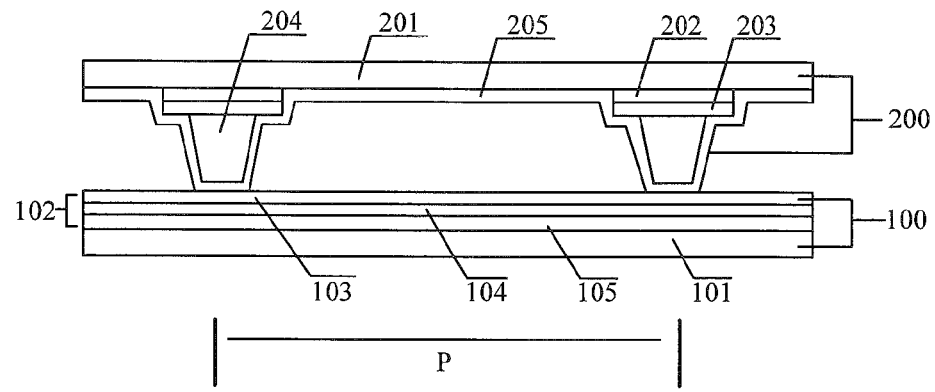
FIG. 3 is a schematic structural view of an organic light emitting display panel according to a first exemplary embodiment of the present invention.

FIG. 3 is a schematic structural view of an organic light emitting display panel according to a first exemplary embodiment of the present invention. As shown in FIG. 3, the organic light emitting display panel according to the embodiment of the present invention includes a first substrate 100 having a first base 101 and a second substrate 200. A plurality of pixels P are provided on the first substrate 100. In order to clearly show the structure of the organic light emitting display panel, FIG. 3 only illustrates exemplarily one complete pixel region. Each pixel P includes an organic light emitting diode 102, which includes an anode 105, a light emitting layer 104 and a cathode 103 arrange sequentially on the first base 101. The second substrate 200 has auxiliary electrodes 202 electrically connected to the cathode 103 of the organic light emitting diode 102, and each auxiliary electrode 202 is located on a side of the second substrate 200 facing the first substrate 100 and corresponding to a gap between adjacent pixels on the first substrate 100. Further, an antireflection layer 203 is formed on the auxiliary electrode 202 for absorbing light rays directed to the auxiliary electrode 202 so as to suppress reflection of the light rays.

It should be noted that, the second substrate 200 according to the first exemplary embodiment of the present invention has auxiliary electrodes 202 electrically connected to the cathode 103 of the organic light emitting diode 102, such technical solution covers the case that the auxiliary electrodes 202 are indirectly electrically connected to each other by one or more other intermediate electrically conductive structures, for example, the intermediate electrically conductive structure may comprise the antireflection layer 203, a spacer 204, a transparent conductive layer 205 or the like, as shown in FIG. 3, or may comprise any other structures, which is not to be limited herein.

According to the organic light emitting display panel of the first embodiment of the present invention, by the auxiliary electrode 202 provided in the second substrate 200 and electrically connected to the cathode 103 of the organic light emitting diode 102, it reduces resistance of the cathode 103 as a whole and increases electrical conductivity of the cathode 103, thereby effectively reducing voltage drop caused by the extremely thin cathode 103 and the extremely high resistance, and improving display uniformity. Furthermore, in comparison to an organic light emitting display panel, in which an auxiliary electrode is provided on the first substrate having a complicated structure and produced through a large number of processes, providing the auxiliary electrode 202 on the second substrate 200 may avoid damaging the organic light emitting diode 102 in the first substrate 100 during producing the auxiliary electrode 202, thereby effectively improving overall good quality rate of the organic light emitting display panel.

Further, in the above described organic light emitting display panel, the antireflection layer 203 is further formed on the auxiliary electrode 202, so that the antireflection layer 203 may absorb the light rays emitted onto the auxiliary electrode 202 and suppress the reflection of the light rays, thereby reducing light leakage between the pixels resulted from the reflection of the auxiliary electrode 202 and improving contrast ratio of the display.

Figure 4:
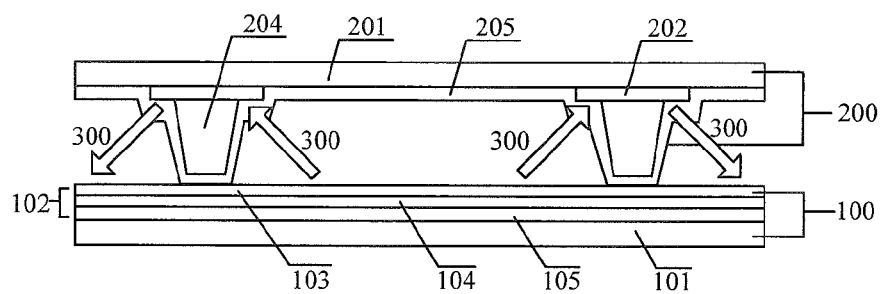
FIG. 4 is a principle schematic view showing light leakage phenomenon between pixels caused by reflection of an auxiliary electrode in an organic light emitting display panel wherein an antireflection layer is not provided.

To explain the technical effect of the organic light emitting display panel of the first embodiment of the present invention, FIG. 4 shows a principle schematic view showing the light leakage phenomenon between the pixels caused by the reflection of the auxiliary electrode in an organic light emitting display panel wherein an antireflection layer is not provided. The conventional material of the auxiliary electrode 202 typically adopts metal material having low resistance, but usually relatively high reflectivity, as a result, if the auxiliary electrode 202 is separately provided and the antireflection layer 203 is not provided on the auxiliary electrode 202, as shown in FIG. 4, then light emitted from the organic light emitting diode 102 in a single pixel is reflected into an adjacent pixel by the auxiliary electrode 202 when the organic light emitting display panel shown in FIG. 4 is in display operation. Therefore, it leads to light leakage and color mixture phenomenon, and reduces the contrast ratio of the display, affecting the overall display effect.

As shown in FIG. 3, in the organic light emitting display panel of the first embodiment of the present invention, the antireflection 203 is provided on the auxiliary electrode 202. Since the antireflection 203 provides a good absorption effect to light rays 300 emitted onto the auxiliary electrode 202 without light rays to be reflected onto the adjacent pixel, it avoids the light leakage phenomenon between the pixels due to the reflection of the auxiliary electrode 202. Meanwhile, the antireflection 203 may be acted as a black matrix, thus it is unnecessary for the second substrate 200 in the organic light emitting display panel of the first embodiment of the present invention to provide a black matrix thereon.

Figure 5:
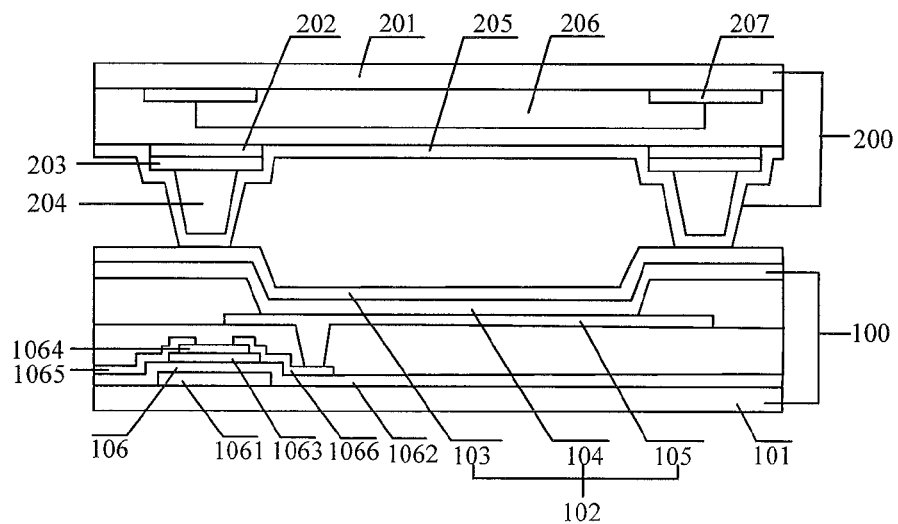
FIG. 5 is a schematic structural view of an organic light emitting display panel according to a second exemplary embodiment of the present invention.
Figure 7:
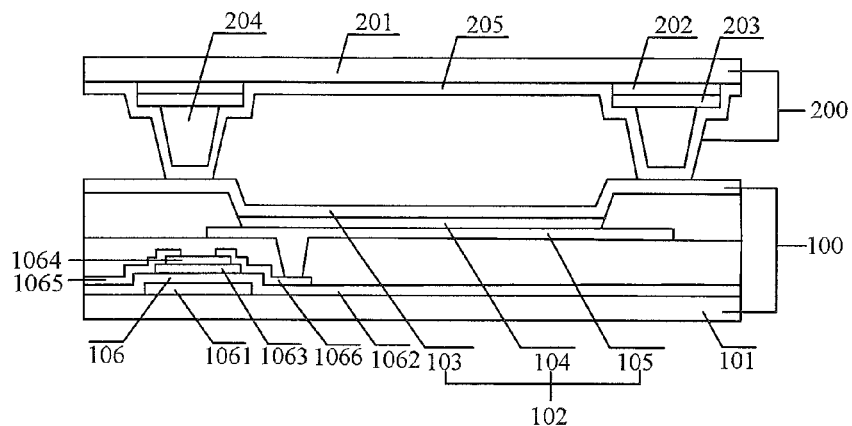
FIG. 7 is a schematic structural view of an organic light emitting display panel according to a third exemplary embodiment of the present invention.

As shown in FIGS. 5 and 7, the organic light emitting display panel according to the second and third exemplary embodiments of the present invention includes a first substrate 100 having a first base 101 and a second substrate 200. A plurality of pixels P are provided on the first substrate 100. In order to clearly show the structure of the organic light emitting display panel, FIGS. 5 and 7 only illustrate exemplarily one complete pixel region. Each pixel P includes an organic light emitting diode 102, which includes a cathode 103, a light emitting layer 104 and an anode 105. The second substrate 200 includes a second base 201 and the second substrate 200 has auxiliary electrodes 202 electrically connected to the cathode 103 of the organic light emitting diode 102. Each auxiliary electrode 202 is located on a side of the second substrate 200 facing the first substrate 100 and corresponding to a gap between adjacent pixels on the first substrate 100. Further, an antireflection layer 203 is formed on the auxiliary electrode 202 for absorbing light rays directed to the auxiliary electrode 202 so as to suppress reflection of the light rays.

Figure 6:
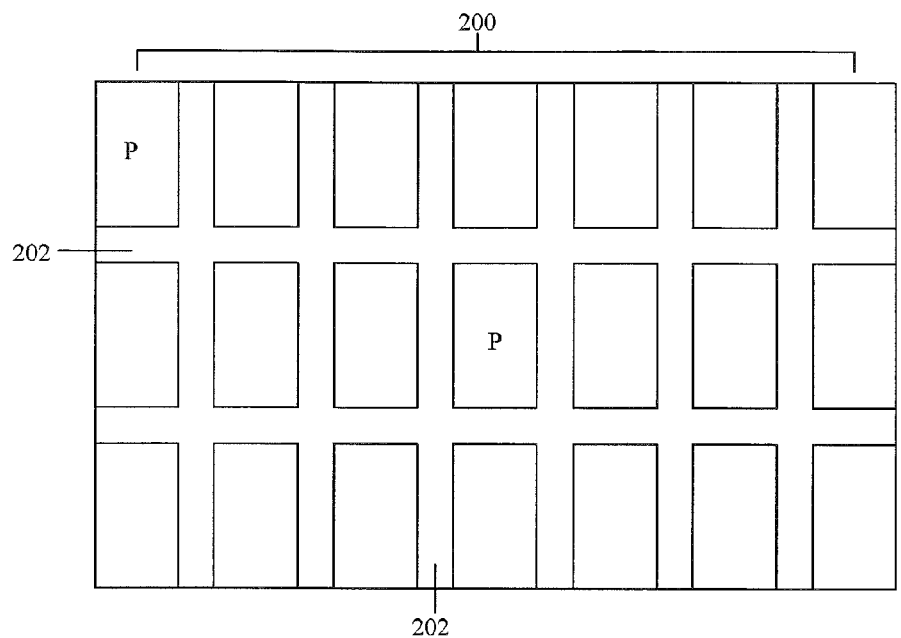
FIG. 6 is a schematic structural view of an auxiliary electrode in a second substrate of an organic light emitting display panel according to an exemplary embodiment of the present invention.

In a further exemplary embodiment, the auxiliary electrode 202 has a grid-like structure. As shown in FIG. 6, the auxiliary electrode 202 is provided on the second substrate 200 and located between adjacent pixel regions P on the second substrate, and the auxiliary electrode 202 has a grid-like structure, in which the auxiliary electrode 202 intersects perpendicularly with each other. Of course, it should be appreciated that although the auxiliary electrode 202 is described as a single grid-like electrode herein, the auxiliary electrode 202 may also be considered to be as a plurality of electrodes, which are electrically connected to each other in a grid arrangement.

Further, in order to sufficiently reduce the resistance of the cathode 103, the material of the auxiliary electrode 202 has low resistance, for example, the material of the auxiliary electrode 202 is selected from aluminum, molybdenum, copper, silver, chrome, gold, and a combination thereof.

In order to reduce the overall resistance of the cathode 103, the auxiliary electrode 202 has a lower resistance than the cathode 103. Thus, by the auxiliary electrode 202 provided on the second substrate 200 and electrically connected to the cathode 103 on the first substrate 100, i.e., the cathode 103 is connected with the auxiliary electrode 202 in parallel, it effectively reduces the overall resistance of the cathode 103, further reduce the voltage drop, thereby improving the display uniformity.

In a further exemplary embodiment, the antireflection layer 203 is located between the auxiliary electrode 202 and the cathode 103, and totally covers a surface of the auxiliary electrode 202. In order to effectively prevent the auxiliary electrode 202 from reflecting the light emitted from the pixel into the adjacent pixel, the antireflection layer 203 is provided to cover the surface of the auxiliary electrode 202 by an area larger than or equal to the surface area of the auxiliary electrode 202, however, the arrangement of the antireflection layer 203 should not affect routinely emitting light rays by the pixel regions, so as to avoid reducing aperture ratio and transmittance of the pixel. Therefore, margins of the antireflection layer 203 is arranged not to go beyond a non-display region located between the adjacent pixels. In an exemplary embodiment, when the surface area of the antireflection layer is equal to that of the auxiliary electrode, the antireflection layer and the auxiliary electrode may be formed by one patterning process. In order to simplify manufacturing process of the antireflection layer 203, the antireflection layer 203 covers the auxiliary electrode 202 by an area equal to the surface area of the auxiliary electrode 202, thus, the antireflection layer 203 and the auxiliary electrode 202 may be formed through one step of lithographing process, thereby simplifying the manufacturing process of the antireflection layer 203 and reducing manufacture cost thereof.

The antireflection layer 203 is made of the material, which is capable of absorbing light rays well and electrically conductive, for example, the antireflection layer is made of black electrically conductive material, or mixed material containing black pigment and electrically conductive powder. The black electrically conductive material may have high black level and high electrical conductivity, for example, ruthenium oxide. The black pigment of the mixed material may comprise black pigment substance, such as cobalt oxide, black-titanium, sub-titanium oxide, graphite and the like. The electrically conductive powder of the mixed material may comprise electrically conductive substance, such as Mo, Al, Cu, Ag, Ti, Fe and the like. Thus, the auxiliary electrode 202 may be connected to the cathode 103 by the antireflection layer 203.

In order to satisfy the requirement for optical micro-cavity design and supporting a thickness of a resultant assembled cell, in an exemplary embodiment, a spacer 204 is formed on the antireflection layer 203, and the contact area between the spacer 204 and the antireflection layer 203 is less than the surface area of the antireflection layer 203. Thus, the part of the antireflection layer 203 which is not in contact with the spacer 204 may be functioned to electrically connect the auxiliary electrode 202 with the cathode 103. It should be noted that the spacer 204 may be arranged on the whole surface of the antireflection layer 203, or may also be arranged on part of the antireflection layer 203 if necessary, which is not to be limited.

In an exemplary embodiment, as shown in FIGS. 5 and 7, a transparent conductive layer 205 is formed on the surface of the antireflection layer 203 and the spacer 204, the transparent conductive layer 205 is brought into contact with the cathode 103 so as to electrically connect the auxiliary electrode 202 to the cathode 103.

The material used for manufacturing the transparent conductive layer comprises any one of indium tin oxide and indium zinc oxide, or a combination thereof.

In an exemplary embodiment, the transparent conductive layer 205 is brought into contact with and electrically connected to the cathode 103 at the gap between the adjacent pixels formed on the first substrate 100.

In an exemplary embodiment, the transparent conductive layer 205 is arranged to totally cover the second substrate 200, in other words, the transparent conductive layer 205 is formed as a single layer on the second substrate 200. In such manufacturing process, it only requires implementing a film forming process of the transparent conductive layer 205 on the second substrate 200 after the manufacturing process of the spacer 204 has been performed on the second substrate 200, without performing subsequent illuminating and etching process, thereby reducing manufacture cost. Certainly, the embodiments of the present invention are not intended to limit the structure of the transparent conductive layer 205, and it is also possible for the transparent conductive layer 205 to have other structure as long as the transparent conductive layer 205 covers the surface of the antireflection layer 203 and the spacer and is electrically connected to the cathode 103. The transparent conductive layer 205 is electrically connected to the surface of the antireflection layer 203 facing to the first substrate, and electrically connected to a side surface of the auxiliary electrode 202. Thus, the auxiliary electrode 202 may be electrically connected to the transparent conductive layer 205 through the side surface of the auxiliary electrode 202, and be electrically connected to the cathode 103 through the transparent conductive layer 205, meanwhile, the auxiliary electrode 202 may be electrically connected to the antireflection layer 203 through an upper surface of the auxiliary electrode 202, and finally electrically connected to the cathode 103 through the transparent conductive layer 205, so as to reduce the resistance of the cathode 103, and improve the display uniformity.

The cathode 103 of the organic light emitting diode 102 is a single electrode layer covering the first substrate 100, the material of the cathode 103 comprises electrically conductive material, such as Ag, Al, Al/Ag, Mg/Ag, Ca/Ag, Sm/Ag and the like. Since such material of the cathode 103 has poor light transmittance performance, the thickness of the cathode 103 is formed as thin as possible, so as to allow the light to pass through. The material of the anode 105 in the organic light emitting diode 102 may comprises Indium Tin Oxide (ITO), Indium Zinc Oxide (IZO) and so on.

The light emitting layer 104 may be considered to be as a light emitting function layer provided between the cathode 103 and the anode 105 of the organic light emitting diode 102. The light emitting layer 104 may only include material capable of emitting light, obviously, it may also include other auxiliary function layers in the prior art, which are provided to emit light well, such as electron injection layer, electron transport layer, hole injection layer, hole transport layer, and so on, and the embodiments of the present invention are not intended to limit the structure of the light emitting layer. In an exemplary embodiment, the organic light emitting diode 102 comprises a light emitting layer 104 for emitting white light. In an exemplary embodiment, as shown in FIG. 5, a related display region between the second base 201 and the auxiliary electrode 202 in the second substrate 200 comprises a filtering layer 206, which may comprises a red filtering layer, a green filtering layer, or a blue filtering layer. It will be appreciated that the filtering layer 206 may also include a white filtering layer or a yellow filtering layer, in order to achieve high transmittance and reduce power consumption for displaying, or achieve any other requirements, and the embodiments of the present invention are not intended to limit the structure of the filtering layer 206. By the arrangement of the filtering layer, the white light emitted from the organic light emitting diode 102 may be turned into a desired color through the filtering layer 206. In addition, the second substrate 200 may also include a black matrix 207 located between the adjacent pixels.

As shown FIGS. 5 and 7, the organic light emitting diode 102 comprises a light emitting layer 104 for emitting red light, green light or blue light, and the emitted light rays with various colors pass through the second substrate 200 to be mixed, then display an image with desired color.

Further, as shown FIGS. 5 and 7, in each pixel, the anodes 105 of the organic light emitting diodes 102 are controlled by various thin film transistors 106, respectively. The thin film transistor 106 includes a gate electrode 1061, a gate insulation layer 1062, an active layer 1063, an etching stop layer 1064, a source electrode 1065, and a drain electrode 1066. Certainly, if necessary, the thin film transistor may also include other structures. The anode 105 of the organic light emitting diode 102 is electrically connected to the drain electrode 1066 of the thin film transistor 106 through a via hole. The embodiments of the present invention are not intended to limit the structure of the thin film transistor 106, and the thin film transistor 106 having other structures also falls into the scope of the embodiments of the present invention.

Although the structure of an organic light emitting display panel according to the exemplary embodiments of the present invention has been described in combination with the accompanying figures, the organic light emitting display panel is not limited to the above described structures. If necessary, the organic light emitting display panel of the embodiments of the present invention may also include other conventional structures, such as a planarization layer, a pixel defining layer, a passivation layer and the like.

According to the organic light emitting display panel of the embodiments of the present invention, by the auxiliary electrode 202 provided in the second substrate 200, and the auxiliary electrode 203 and the transparent conductive layer 205 electrically connected to the cathode 103 of the organic light emitting diode 102, it reduces the resistance of the cathode 103, and increases the electrical conductivity of the cathode 103, thereby effectively reducing the voltage drop due to the extremely thin cathode and the extremely high resistance, and improving the display uniformity. Furthermore, in the organic light emitting display panel of the embodiments of the present invention, the auxiliary electrode 202 is provided on the second substrate 200. In comparison to the conventional organic light emitting display panel, in which the auxiliary electrode is provided on the first substrate having a complicated structure and produced through a large number of processes, providing the auxiliary electrode 202 on the second substrate 200 may avoid damaging the organic light emitting diode 102 in the first substrate 100 during producing the auxiliary electrode, thereby effectively improving overall good quality rate of the organic light emitting display panel. Meanwhile, in the organic light emitting display panel of the embodiments of the present invention, the antireflection layer 203 is further formed on the auxiliary electrode 202, so that the antireflection layer 203 may suppress the reflection of the light rays by absorbing the light rays emitted onto the auxiliary electrode 202, thereby reducing the light leakage between the pixels due to the reflection of the auxiliary electrode 202 and improving contrast ratio of the display.

According to a further aspect of the present disclosure, there is provided a display apparatus, comprising the organic light emitting display panel according to the above various embodiments. The display apparatus may include: a cellphone, a flat computer, a television, a display device, a notebook computer, a digital photo frame, a navigator, and any other products or components having a display function.

According to the display apparatus of the embodiments of the present invention, which has the above various organic light emitting display panel, by the auxiliary electrode 202 provided in the second substrate 200 and electrically connected to the cathode 103 of the organic light emitting diode 102, it reduces the resistance of the cathode and increases the electrical conductivity of the cathode 103, thereby effectively reducing voltage drop caused by the extremely thin cathode 103 and the extremely high resistance, and improving display uniformity. Therefore, the display apparatus has more excellent display effect. In addition, the antireflection layer 203 is formed on the auxiliary electrode 202, so that the antireflection layer 203 may suppress the reflection of the light rays by absorbing the light rays emitted onto the auxiliary electrode 202, thereby reducing the light leakage between the pixels due to the reflection of the auxiliary electrode 202 and improving contrast ratio of the display.

The above embodiments are only intended to explain the technical solutions of the present invention, but not to limit the present invention. Although the present invention is described in detail with reference to the preferred embodiments, it should be understood by the person skilled in the art that any modification or equivalent may be made to the technical solutions of the present invention without departing from the spirit and principle of the present invention.

What is claimed is:

1. An organic light emitting display panel, comprising:
    a first substrate provided with a plurality of pixels each comprising an organic light emitting diode;
    a second substrate having at least one auxiliary electrode electrically connected to a cathode of the organic light emitting diode, each auxiliary electrodes being located on a side of the second substrate facing the first substrate and aligned with a gap between adjacent pixels on the first substrate in a thickness direction of the organic light emitting display panel; and
    at least one antireflection layer, in each pixel, the antireflection layer entirely covering a surface of the auxiliary electrode and located between the auxiliary electrode and the organic light emitting diode of the pixel to absorb interior light rays directed to the auxiliary electrode from the organic light emitting diode of the pixel and avoid light leakage from the pixel to an adjacent pixel.

2. The organic light emitting display panel according to claim 1, wherein the auxiliary electrode has a grid-like structure.

3. The organic light emitting display panel according to claim 1, wherein the material of the auxiliary electrode is selected from Al, Mo, Cu, Ag, Cr, Au, and combinations thereof.

4. The organic light emitting display panel according to claim 1, wherein the auxiliary electrode has a lower resistance than the cathode.

5. The organic light emitting display panel according to claim 1, wherein the antireflection layer covers the surface of the auxiliary electrode by an area larger than or equal to the surface area of the auxiliary electrode, and margins of the antireflection layer do not go beyond a non-display region located between the adjacent pixels.

6. The organic light emitting display panel according to claim 1, wherein the antireflection layer is made of black electrically conductive material, or mixed material containing black pigment and electrically conductive powder.

7. The organic light emitting display panel according to claim 6, wherein the black electrically conductive material comprises ruthenium oxide.

8. The organic light emitting display panel according to claim 6, wherein the black pigment of the mixed material comprises at least one of cobalt oxide, black-titanium, sub-titanium oxide and graphite, and the electrically conductive powder of the mixed material comprises at least one of Mo, Al, Cu, Ag, Ti and Fe.

9. The organic light emitting display panel according to claim 1, wherein a spacer is formed on the antireflection layer, the contact area between the spacer and the antireflection layer being less than the surface area of the antireflection layer.

10. The organic light emitting display panel according to claim 9, wherein a transparent conductive layer is formed on the surface of the antireflection layer and the spacer, the transparent conductive layer being in contact with the cathode so as to electrically connect the auxiliary electrode to the cathode.

11. The organic light emitting display panel according to claim 10, wherein the transparent conductive layer is made of any one of indium tin oxide and indium zinc oxide, or a combination thereof.

12. The organic light emitting display panel according to claim 10, wherein the transparent conductive layer is electrically connected to the cathode at the gap between the adjacent pixels on the first substrate.

13. The organic light emitting display panel according to claim 10, wherein the transparent conductive layer is arranged to totally cover the second substrate, and electrically connected to a surface of the antireflection layer facing the first substrate and a side surface of the auxiliary electrode.

14. The organic light emitting display panel according to claim 1, wherein the organic light emitting diode comprises a light emitting layer for emitting white light.

15. The organic light emitting display panel according to claim 14, wherein a display region of the second substrate comprises a red filtering layer, a green filtering layer, and a blue filtering layer.

16. The organic light emitting display panel according to claim 1, wherein the organic light emitting diode comprises a light emitting layer for emitting red light, green light or blue light.

17. The organic light emitting display panel according to claim 1, wherein the second substrate comprises a black matrix located between the adjacent pixels.

18. The organic light emitting display panel according to claim 1, wherein the first substrate further comprises a plurality of thin film transistors electrically connected to the organic light emitting diode.

19. A display apparatus, comprising the organic light emitting display panel according to claim 1.

* * * * *